United States Patent
Kim (10) Patent No.: US 9,099,684 B2
(45) Date of Patent: Aug. 4, 2015

(54) ORGANIC LIGHT EMITTING DISPLAY DEVICE AND METHOD FOR FABRICATING THE SAME

(71) Applicant: Samsung Display Co., Ltd., Yongin, Gyeonggi-Do (KR)

(72) Inventor: Young-Il Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 112 days.

(21) Appl. No.: 13/907,694

(22) Filed: May 31, 2013

(65) Prior Publication Data

US 2014/0131673 A1     May 15, 2014

(30) Foreign Application Priority Data

Nov. 15, 2012 (KR) .................. 10-2012-0129665

(51) Int. Cl.
| | |
|---|---|
| H01L 27/32 | (2006.01) |
| H01L 21/20 | (2006.01) |
| H01L 51/56 | (2006.01) |
| H01L 51/52 | (2006.01) |

(52) U.S. Cl.
CPC ............ *H01L 51/56* (2013.01); *H01L 27/3248* (2013.01); *H01L 51/5225* (2013.01)

(58) Field of Classification Search
CPC ............ H01L 27/3244; H01L 27/3276; H01L 27/3262; H01L 27/3246; H01L 27/3248; H01L 27/3258; H01L 2227/323

USPC ................ 257/59, 72, 83, E33.064, E21.414; 438/24, 157

See application file for complete search history.

(56) References Cited

U.S. PATENT DOCUMENTS

| | | | |
|---|---|---|---|
| 2006/0243976 A1 | 11/2006 | Shin | |
| 2009/0108740 A1* | 4/2009 | Kim et al. ............... | 313/504 |
| 2011/0248276 A1* | 10/2011 | Son et al. ................. | 257/65 |

FOREIGN PATENT DOCUMENTS

| | | |
|---|---|---|
| KR | 10-0534584 | 12/2005 |
| KR | 10-0731739 | 6/2007 |

OTHER PUBLICATIONS

Korean Patent Abstracts Publication No. KR10-2005-0105856A dated Nov. 8, 2005 cited for KR10-0534584, 1 page.
Korean Patent Abstracts Publication No. KR10-2006-0112964 A dated Nov. 2, 2006 cited for KR10-0731739, 1 page.

* cited by examiner

*Primary Examiner* — Minh-Loan Tran
(74) *Attorney, Agent, or Firm* — Christie, Parker & Hale, LLP

(57) ABSTRACT

Embodiments of the present invention include an organic light emitting display device and a method for fabricating the same. The organic light emitting display device may include a thin film transistor on a base substrate and including a semiconductor layer, a gate electrode, a source electrode, and a drain electrode; and an organic light emitting diode, which includes a first electrode connected to the drain electrode, an organic layer on the first electrode, and a second electrode on the organic layer. The drain electrode may have a larger area than the first electrode.

20 Claims, 9 Drawing Sheets

ORGANIC LIGHT EMITTING DISPLAY DEVICE AND METHOD FOR FABRICATING THE SAME

CROSS-REFERENCE TO RELATED APPLICATIONS

This application claims priority to and the benefit of Korean Patent Application No. 10-2012-0129665, filed on Nov. 15, 2012, the entire contents of which are hereby incorporated by reference.

BACKGROUND

1. Field

The present invention relates to organic light emitting display devices and methods for fabricating the same.

2. Description of the Related Art

In general, an organic light emitting display device has a structure in which an organic layer is on an anode electrode whose portion is exposed by a pixel defining layer and a cathode electrode is on the organic layer. Holes and electrons are injected into the organic layer from the anode electrode and the cathode electrode, respectively. In the organic layer, the injected electrons and holes are recombined to generate excitons. The excitons release energy in the form of light, which is released when falling from an excited state to a ground state.

Studies have been conducted to print the organic layer that the organic light emitting display device implements in full color. However, the organic layer formed by printing may have its edge region thicker than its center region. For this reason, luminescent properties of the edge region and the center region may be different from each other in each pixel, and thus, non-uniform light may be emitted. As a result, display quality of the organic light emitting display device may be degraded.

SUMMARY

Embodiments of the present invention provide an organic light emitting display device and a method of fabricating the same.

According to an aspect of the present invention, an organic light emitting display device may include: a thin film transistor on a base substrate and including a semiconductor layer, a gate electrode, a source electrode, and a drain electrode; and an organic light emitting diode including a first electrode connected to the drain electrode, an organic layer on the first electrode, and a second electrode on the organic layer. Here, the drain electrode has a larger area than the first electrode.

A thickness of a first portion of the organic layer corresponding to a region in which the first electrode contacts the drain electrode may be smaller than that of a second portion of the organic layer corresponding to a region in which the first electrode does not contact the drain electrode.

The first electrode may include transparent conductive oxide, and a surface resistance of the first electrode may be from about 10 $\Omega/cm^2$ to about 300 $\Omega/cm^2$.

The drain electrode may be configured to reflect light.

According to an aspect of the present invention. an organic light emitting display device includes: a semiconductor layer on a base substrate and including a source region and a drain region; a gate electrode on the semiconductor layer and insulated from the semiconductor layer; a source electrode connected to the source region and a drain electrode connected to the drain region; a passivation layer having a first opening exposing the drain electrode; a first electrode connected to the drain electrode, and arranged at the first opening and on the passivation layer; a pixel defining layer having a second opening exposing a portion of the first electrode; an organic layer on the first electrode; and a second electrode on the organic layer. Here, an area exposed by the second opening is larger than that exposed by the first opening.

In the organic layer, a thickness of a first region corresponding to the first opening may be smaller than that of a second region corresponding to the second opening outside the first opening.

The first electrode may include a transparent conductive oxide, and a surface resistance of the first electrode may be from about 10 $\Omega/cm^2$ to about 300 $\Omega/cm^2$.

The drain electrode may be configured to reflect light.

According to an embodiment of the present invention, a surface of the pixel defining layer has liquid-repellent properties.

The drain electrode may have a larger area than the first electrode.

According to an aspect of the present invention, a method of fabricating an organic light emitting display device includes: forming a thin film transistor including a semiconductor layer, a gate electrode, a source electrode, and a drain electrode on a base substrate; forming a passivation layer covering the thin film transistor and having an opening exposing the drain electrode; and forming an organic light emitting diode including a first electrode connected to the drain electrode, an organic layer on the first electrode, and a second electrode on the organic layer. Here, the drain electrode has a larger area than the first electrode.

A thickness of a first portion of the organic layer corresponding to a region in which the first electrode contacts the drain electrode may be smaller than that of a second portion of the organic layer corresponding to a region in which the first electrode does not contact the drain electrode.

The first electrode may include a transparent conductive oxide, and a surface resistance of the first electrode may be from about 10 $\Omega/cm^2$ to about 300 $\Omega/cm^2$.

The drain electrode may be configured to reflect light.

According to an aspect of the present invention, a method for fabricating an organic light emitting display device includes: forming a semiconductor layer on a base substrate; forming a gate electrode insulated from the semiconductor layer; forming a source electrode and a drain electrode connected to a source region and a drain region of the semiconductor layer, respectively; forming a passivation layer having a first opening exposing at least a portion of the drain electrode; forming a first electrode on the drain electrode and the passivation layer; forming a pixel defining layer having a second opening exposing at least a portion of the first electrode; forming an organic layer on the first electrode; and forming a second electrode on the organic layer. Here, an area exposed by the second opening is larger than that exposed by the first opening.

The method may further include treating a surface of the pixel defining layer to have liquid-repellent properties.

In the organic layer, a thickness of a first region corresponding to the first opening may be smaller than that of a second region corresponding to the second opening outside the first opening.

The first electrode may include a transparent conductive oxide, and a surface resistance of the first electrode may be from about 10 $\Omega/cm^2$ to about 300 $\Omega/cm^2$.

The drain electrode may have a larger area than the first electrode.

The drain electrode may be configured to reflect light.

BRIEF DESCRIPTION OF THE DRAWINGS

The above and other aspects and features of the present invention will become more apparent in view of the attached drawings and the accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

Aspects and features of the present invention, and methods of achieving them, will be apparent from the following exemplary embodiments that are described in more detail below with reference to the accompanying drawings. It should be noted, however, that the present invention is not limited to the following exemplary embodiments, and may be implemented in various forms.

In the specification, it will be understood that when an element is referred to as being "on" another element (e.g., layer, substrate, etc.), it can be directly on the other element, or one or more intervening elements may also be present. In the drawings, thicknesses of elements may be exaggerated for clarity of illustration.

Exemplary embodiments of the invention will be described below with reference to the exemplary drawings of the invention. The exemplary drawings may be modified, for example, to correspond to manufacturing techniques and/or tolerances. Accordingly, the exemplary embodiments of the invention are not limited to specific configurations shown in the drawings, and may include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention. Though terms like a first, a second, and a third are used to describe various elements in various embodiments of the present invention, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will now be described more fully with reference to accompanying drawings.

Figure 1:
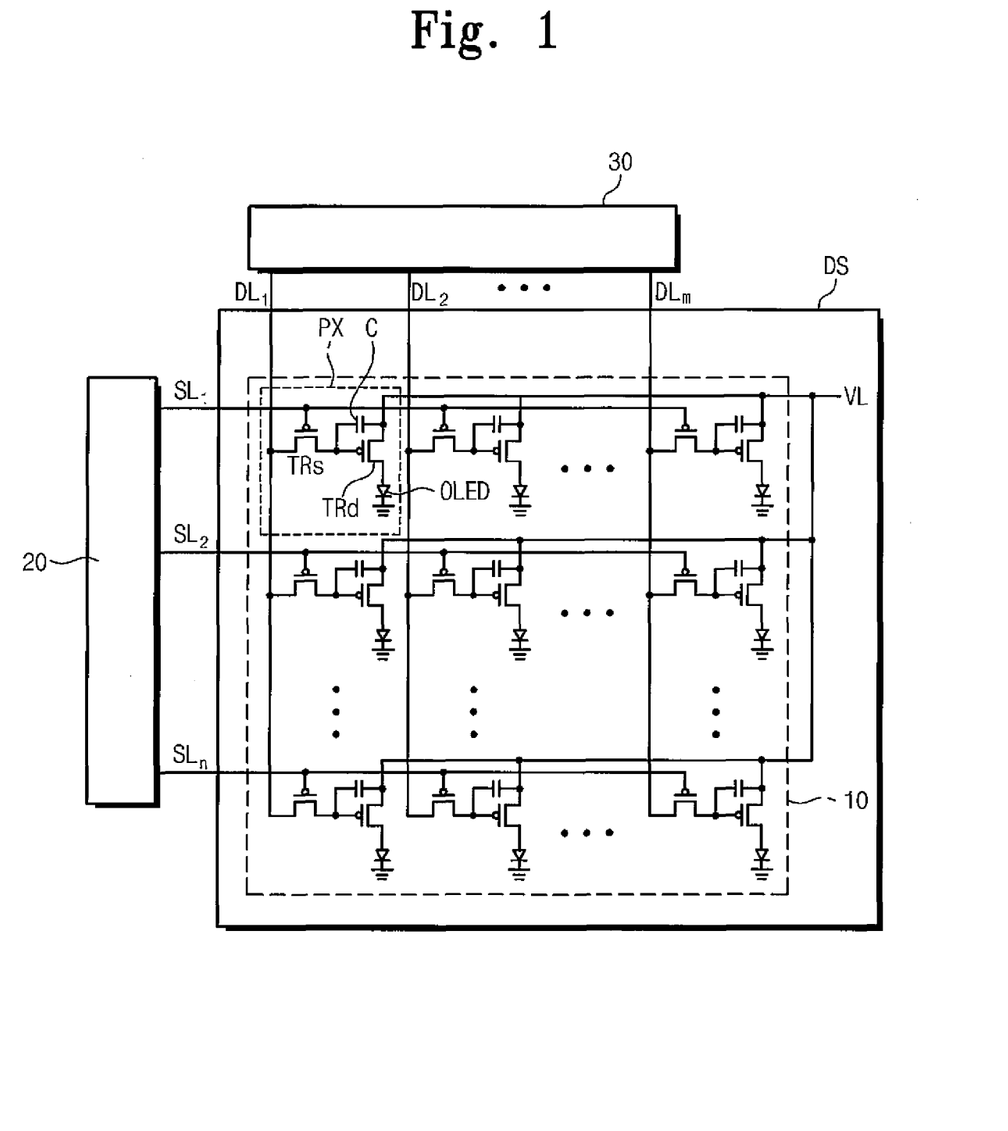
FIG. 1 is a schematic circuit diagram of a flat panel display device to which a display substrate according to an embodiment of the present invention is applied.

FIG. 1 is a schematic circuit diagram of a flat panel display device to which a display substrate according to an embodiment of the present invention is applied.

Referring to FIG. 1, a display substrate DS according to an embodiment of the present invention may be used in flat panel display devices such as liquid crystal display devices or organic electroluminescent display devices. In this embodiment, an example of applying the display substrate DS to an organic electroluminescent display device will now be described below.

The organic electroluminescent display device may include a display substrate DS including a display unit 10 for image display, a scan drive 20, and a data drive 30.

The scan drive 20 and the data drive 30 may be connected to signal wires to be electrically connected to the display unit 10, respectively. The signal wires include scan lines $SL_1$, $SL_2$, and SLn, data lines $DL_1$, $DL_2$, and DLm, and power supply lines VL, and any one of the signal wires may cross another signal wire.

In FIG. 1, the scan drive 20 is electrically connected to the display unit 10 by the scan lines $SL_1$, $SL_2$, and SLn. The scan drive 20 may transmit a scan signal to the display unit 10 through the scan lines $SL_1$, $SL_2$, and SLn. The scan lines $SL_1$, $SL_2$, and SLn may extend on the display substrate DS in one direction, e.g., a first direction.

The data drive 30 is electrically connected to the data lines $DL_1$, $DL_2$, and DLm through a pad (not shown) located (e.g., disposed or arranged) in a pad area PA of the display substrate DS. Thus, the data drive 30 may be electrically connected to the display unit 10 by the data lines $DL_1$, $DL_2$, and DLm. The data drive 30 may transmit a data signal to the display unit 10 through the data lines $DL_1$, $DL_2$, and DLm.

The data lines $DL_1$, $DL_2$, and DLm may extend in a direction differing from that of the scan lines $SL_1$, $SL_2$, and SLn, i.e., a second direction, to cross the scan lines $SL_1$, $SL_2$, SLn. The data lines $DL_1$, $DL_2$, and DLm and the scan lines $SL_1$, $SL_2$, and SLn may cross each other.

The power supply lines VL may apply power to the display unit 10. The power supply lines VL may cross the data lines $DL_1$, $DL_2$, and DLm and the scan lines $SL_1$, $SL_2$, and SLn.

The display unit 10 may include a plurality of pixels PX. Each of the pixels PX may be electrically connected to a corresponding one of the data lines $DL_1$, $DL_2$, and DLm, a corresponding one of the scan lines $SL_1$, $SL_2$, and SLn, and a corresponding one of the power supply lines VL. Each of the pixels PX may include a switching thin film transistor TRs, a driving thin film transistor TRd, a capacitor C, and an organic light emitting diode (OLED).

The switching thin film transistor TRs is electrically connected to the corresponding one of the scan lines $SL_1$, $SL_2$, and SLn and the corresponding one of the data lines $DL_1$, $DL_2$, and DLm. The switching thin film transistor TRs and the driving thin film transistor TRdd include a semiconductor layer, a gate electrode insulated from the semiconductor layer, and a source electrode and a drain electrode connected to the semiconductor layer.

The driving of the organic electroluminescent display device will now be described in brief. A scan signal from the scan drive 20 and a data signal from the data drive 30 are transmitted to each pixel PX along the scan lines $SL_1$, $SL_2$, and SLn and the data lines $DL_1$, $DL_2$, and DLm. A switching thin film transistor TRs of each pixel PX receiving the scan signal and the data signal may turn on/off the driving thin film transistor TRd. The driving thin film transistor TRd supplies driving current based on the data signal to the OLED. The OLED receiving the driving current may generate light using the driving current.

The capacitor C for storing the data signal for a period is coupled between the drain electrode of the switching thin film transistor TRs and the gate electrode of the driving thin film transistor TRd. The data signal stored in the capacitor C may apply a data signal to the gate electrode of the driving thin film transistor TRd even when the switching thin film transistor TRs is turned off.

Although not shown in detail, the organic electroluminescent display device may further include a plurality of thin film transistors and capacitors, for example, to compensate a threshold voltage of the driving thin film transistor or a deterioration of the OLED.

Hereinafter, a structure of the display substrate DS according to an embodiment of the present invention will now be described in detail with reference to FIGS. 2 and 3. Let it be assumed that for the display substrate DS, a direction relative to the display substrate where the switching thin film transistor TRs, the driving thin film transistor TRd, and the OLED are located (e.g., located or arranged) is referred to as the "top".

Figure 2:
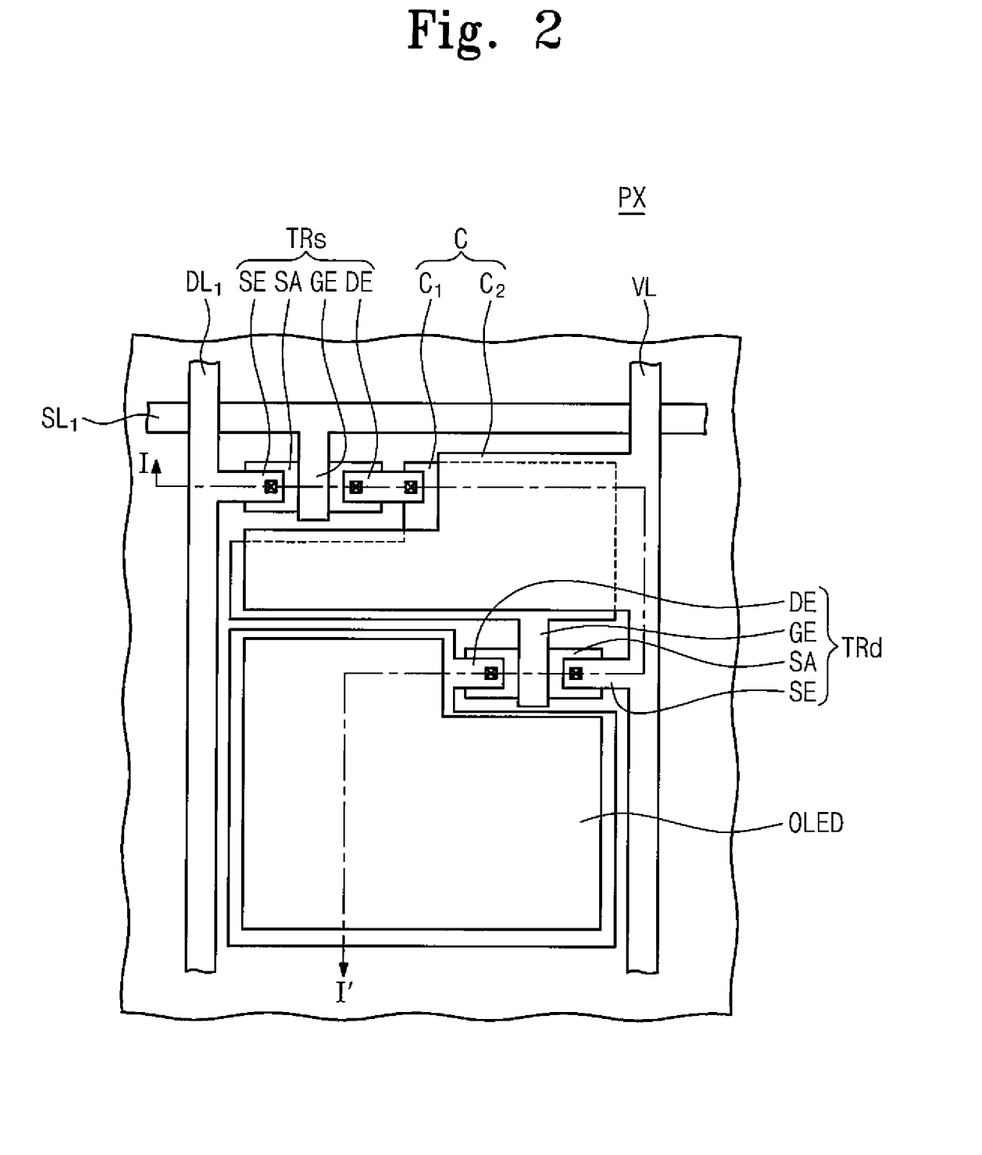
FIG. 2 is a schematic top plan view of one pixel in FIG. 1.
Figure 3:
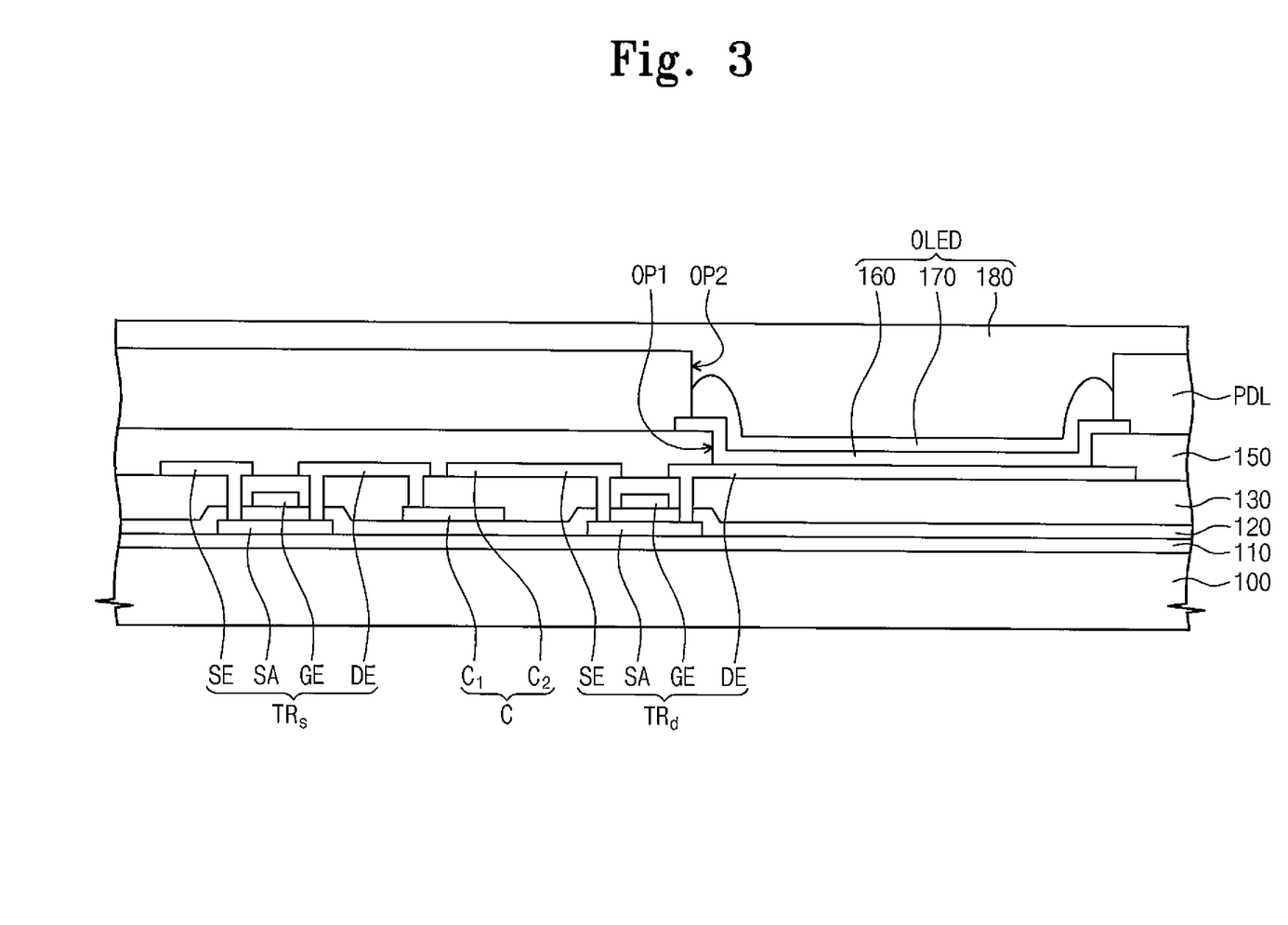
FIG. 3 is a schematic cross-sectional view taken along the line I-I' in FIG. 2.

FIG. 2 is a schematic top plan view of one pixel in FIG. 1, and FIG. 3 is a schematic cross-sectional view taken along the line I-I' in FIG. 2.

Referring to FIGS. 2 and 3, each pixel PX of the display substrate DS may be electrically connected to a corresponding one of the data lines $DL_1$, $DL_2$, and DLm, a corresponding one of the scan lines $SL_1$, $SL_2$, and SLn, and a corresponding one of the power supply lines VL. In addition, each pixel PX may include a switching thin film transistor TRs, a driving thin film transistor TRd, a capacitor C electrically connected to the switching thin film transistor TRs and the driving thin film transistor TRd, and the OLED.

Hereinafter, a pixel PX connected to a first scan line $SL_1$ and a first data line $DL_1$ will now be explained as an example.

The switching thin film transistor TRs is connected to the first scan line $SL_1$ and the first data line $DL_1$. The switching thin film transistor TRs and the driving thin film transistor TRd include a semiconductor layer SA, a gate electrode GE insulated from the semiconductor layer SA, and a source electrode SE and a drain electrode DE connected to the semiconductor layer SA.

More specifically, the switching thin film transistor TRs and the driving thin film transistor TRd include a semiconductor layer SA located on a base substrate 100 made of, for example, a glass or transparent plastic material through which light can pass, a gate electrode GE insulated from the semiconductor layer SA, and a source electrode SE and a drain electrode DE connected to the semiconductor layer SA.

The semiconductor layer SA may include any one of amorphous silicon (a-Si), polycrystalline silicon (p-Si), and semiconductor oxide. Regions connected to the source electrode SE and the drain electrode DE may be impurity-doped or injected source and drain regions, respectively, and a region between the source and drain regions may be a channel region. The semiconductor oxide may include at least one of Zn, In, Ga, Sn, and a combination thereof. For example, the semiconductor oxide may include indium-gallium-zinc oxide (IGZO).

Although not shown in the drawings, when the semiconductor layer SA includes semiconductor oxide, a light blocking layer may be located above and below the semiconductor oxide active layer SA to block light flowing into the semiconductor oxide active layer SA.

A buffer layer 110 may be located between the semiconductor layer SA and the base substrate 100. The buffer layer 110 may be a silicon oxide layer or a silicon nitride layer. Alternatively, the buffer layer 110 may be a multi-layer structure including the silicon oxide layer and the silicon nitride layer. The buffer layer 110 prevents impurities from diffusing into the switching thin film transistor TRs, the driving thin film transistor TRd, and the OLED, and prevents penetration of moisture and oxygen. In addition, the buffer layer 110 may planarize a surface of the base substrate 100.

A gate insulating layer 120 is located on the semiconductor layer SA and the base substrate 100. The gate insulating layer 120 covers the semiconductor layer SA to insulate the semiconductor layer SA and the gate electrode GE. The gate insulating layer 120 includes at least one of silicon oxide ($SiO_2$) and silicon nitride (SiNx).

The first scan line $SL_1$ extending in one direction and a first capacitor electrode $C_1$ are located on the gate insulating layer 120. A portion of the first scan line $SL_1$ may be the gate electrode GE overlapping the channel region of the semiconductor layer SA.

An interlayer dielectric 130 may be located on the gate insulating layer 120 and the gate electrode GE. Similar to the gate insulating layer 120, the interlayer dielectric 130 may include at least one of silicon oxide and silicon nitride. The interlayer dielectric 130 includes a contact hole to expose a portion of the source region and the drain region of the semiconductor layer SA.

The first data line $DL_1$ insulated from the first scan line $SL_1$ to cross the same, the power supply line VL, and the source electrode SE and the drain electrode DE are located on the interlayer dielectric 130. The source electrode SE, the drain electrode DE, a second capacitor electrode $C_2$, the first data line $DL_1$, and the power supply line VL may include a material to reflect light. For example, the source electrode SE, the drain electrode DE, the second capacitor electrode $C_2$, the first data line $DL_1$, and the power supply line VL may include aluminum (Al) or an aluminum-alloy (Al-alloy).

The source electrode SE and the drain electrode DE may be insulated from the gate electrode GE by the interlayer dielectric 130. In addition, the source electrode SE and the drain electrode DE are respectively connected to the source region and the drain region through contact holes.

In each pixel PX, the drain electrode DE of the driving thin film transistor TRd may extend to a region in which the switching thin film transistor TRs, the capacitor C, and the driving thin film transistor TRd are not located.

The capacitor C includes a first capacitor electrode $C_1$ and a second capacitor electrode $C_2$. The first capacitor electrode $C_1$ may be made of the same material as the first scan line $SL_1$ and the gate electrode GE and may be located on the same layer. That is, the first capacitor electrode $C_1$ may be located on the gate insulating layer 120. The second capacitor electrode $C_2$ may be made of the same material as the first data line $DL_1$, the power supply line VL, the source electrode SE, and the drain electrode DE and may be located on the same layer.

A passivation layer 150 is located on the base substrate 100 where the switching thin film transistor TRs, the driving thin film transistor TRd, and the capacitor C are located. The passivation layer 150 includes a first opening OP1 to expose a portion of the drain electrode DE.

The passivation layer 150 may include at least one layer. For example, the passivation layer 150 may include an inorganic passivation layer and an organic passivation layer located on the inorganic passivation layer. The inorganic passivation layer may include at least one of silicon nitride and silicon oxide. The organic passivation layer may include at least one of acryl, polyimide (PI), polyamide (PA), and benzocyclobutene (BCB). That is, the organic passivation layer may be a planarized layer that is transparent and flexible to reduce and planarize winding of a lower structure.

According to an embodiment of the present invention, the OLED is connected to the drain electrode exposed by the first opening OP1. The OLED includes a first electrode 160, an organic layer 170 located on the first electrode 160, and a second electrode 180 located on the organic layer 170. One of the first and second electrodes 160 and 180 may an anode electrode, and the other may be a cathode electrode. Hereinafter, embodiments where the first electrode 160 is an anode electrode and the second electrode 180 is a cathode electrode will be described as an example.

The first electrode 160 may be connected to the drain electrode DE exposed by the passivation layer 150. For example, a portion of the first electrode 160 may be located on the drain electrode DE exposed by the first opening OP1 to be connected to the drain electrode DE. The other portion of the first electrode 160 may extend along a side surface of the first opening OP1 to be located even on the passivation layer 150.

The first electrode 160 may include a transparent conductive oxide. For example, the first electrode 160 may include one of ITO (Indium Tin Oxide), IZO (Indium Zinc Oxide), AZO (aluminum Zinc Oxide), GZO (gallium doped zinc oxide), ZTO (zinc tin oxide), GTO (Gallium tin oxide), and FTO (fluorine doped tin oxide).

Surface resistance of the first electrode 160 may be about 10 $\Omega/cm^2$ to about 300 $\Omega/cm^2$.

In each pixel PX, an area occupied by the first electrode 160 may be smaller than that occupied by the drain electrode DE of the driving thin film transistor TRd.

A portion of the first electrode 160 may be exposed by a second opening OP2 of a pixel defining layer PDL. A surface of the pixel defining layer PDL may have liquid-repellent properties.

The pixel defining layer PDL may include an organic insulating material. For example, the pixel defining layer PDL may include at least one of polystylene, polymethyl methacrylate (PMMA), polyacrylonitrile (PAN), polyamide, polyimide, polyarylether, heterocyclic polymer, parylene, fluorinated polymer, epoxy resin, benzocyclobutene series resin, siloxane series resin, and silane.

In each pixel PX, an area opened by the second opening OP2 may be equal to or larger than that opened by the first opening OP1. Thus, the first electrode 160 may be exposed to a portion of a region formed on the passivation layer 150 by the second opening OP2.

The organic layer 170 may be located on the first electrode 160 and exposed by the second opening OP2. That is, the organic layer 170 may be located not only in a region formed on the drain electrode DE of the first electrode 160 but also in the region formed on the passivation layer 150. The organic layer 170 located in a region corresponding to the first opening OP1 may have a greater thickness than the organic layer 170 located in a region corresponding to the second opening OP2. That is, an edge region of the organic layer 170 may have a greater thickness than the other regions. This is because the surface of the pixel defining layer PDL has the liquid-repellent properties.

The organic layer 170 includes at least an emission layer EML and may have a multi-layered thin film structure. For example, the organic layer 170 may include a hole injection layer (HIL) injecting holes, a hole transport layer (HTL) having superior hole transportability and blocking migration of non-combined electrons at the EML to increase a chance for hole-electron recombination, the EML emitting light by recombination of injected electrons and holes, a hole blocking layer (HBL) blocking migration of non-combined holes at the EML, an electron transport layer (ETL) for smoothly transporting electrons to the EML, and an electron injection layer (EIL) injecting electrons.

The second electrode 180 allows light generated at the organic layer 170 to pass therethrough, and allows light reflected from the drain electrode DE of the driving thin film transistor TRd to pass therethrough. For example, the second electrode 180 may include at least one of metals with low work function such as Ag, Mg, Al, Pt, Pd, Au, Ni, Nd, Ir, Cr, Li, Ca, and an alloy thereof and include a metal thin film formed on the organic layer 170 to a thickness suitable to allow light to pass therethrough. The second electrode 180 may further include transparent conductive oxide on the metal thin film to prevent voltage drop (IR-drop) of the metal thin film.

In the organic light emitting display device, surface resistance of the first electrode 160 including the transparent conductive oxide may be about 10 $\Omega/cm^2$ to about 300 $\Omega/cm^2$ and current may not be smoothly supplied to a region of the first electrode 160 that is not connected to (or contacting) the drain electrode DE of the driving thin film transistor TRd, i.e., the first electrode 160 located on the passivation layer 150. Accordingly, in one or more embodiments of the present invention, holes are not supplied to the organic layer 170 located in a region thicker than the other region, i.e., a region corresponding to the second opening OP2 outside the first opening OP1. For this reason, the OLED according to an embodiment of the present invention does not generate light in the region corresponding to the second opening OP2 outside the first opening OP1, but instead, generates light (e.g., only generates light) in a region corresponding to the first opening OP1. As a result, because only the light generated in the region corresponding to the first opening OP1 is emitted in each pixel of the organic light emitting display device, uniform light may be emitted to improve display quality of the organic light emitting display device.

FIGS. 4 to 9 are schematic cross-sectional views illustrating a method for fabricating an organic light emitting display device illustrated in FIGS. 1 to 3 according to an embodiment of the present invention.

Figure 4:
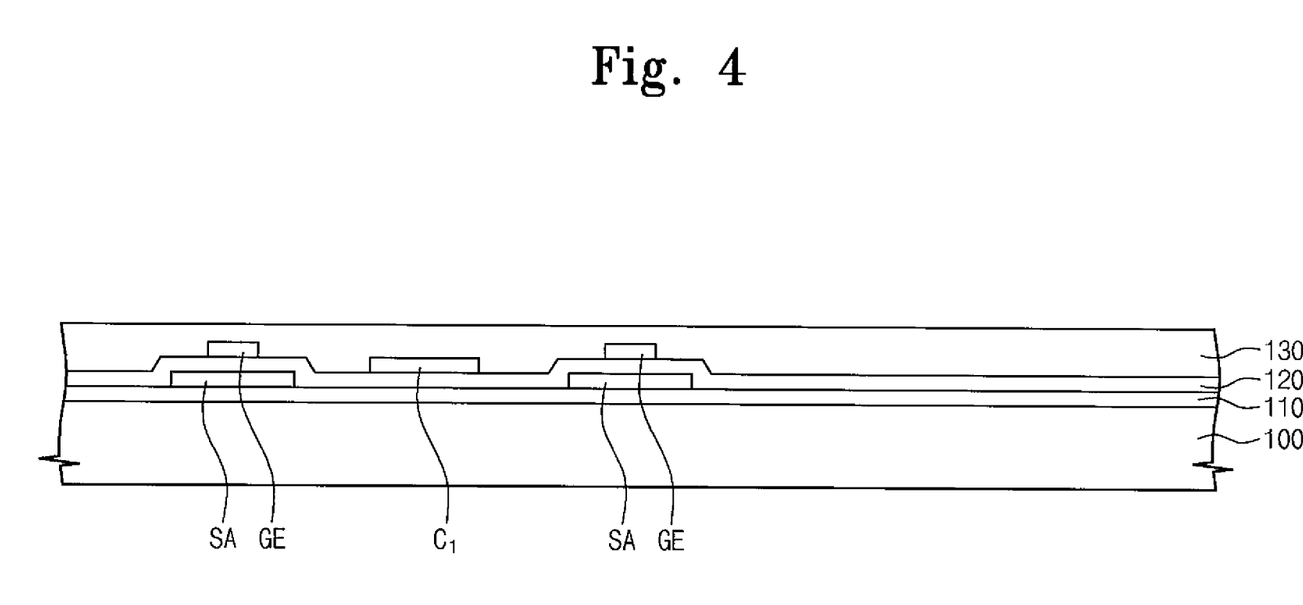
FIGS. 4 to 9 are schematic cross-sectional views illustrating a method for fabricating an organic light emitting display device illustrated in FIGS. 1 to 3.

Referring to FIG. 4, a base substrate 100 is provided.

The base substrate 100 may be formed of a transparent insulating material. For example, the base substrate 100 may be a rigid-type insulating substrate formed of polymer such as glass or transparent plastic. In the case that the insulating substrate 100 is a plastic substrate, it may be formed of polyethylene terephthalate (PET), fiber reinforced plastic or polyethylene naphthalate (PEN). The base substrate 100 may be a transparent flexible-type insulating substrate.

A buffer layer 110 may be formed on the base substrate 110. The buffer layer 110 may be a silicon oxide layer or a silicon nitride layer. Alternatively, the buffer layer 110 may be a multi-layered structure including the silicon oxide layer and the silicon nitride layer. The buffer layer 110 prevents diffusion of impurities included in the base substrate 100. The buffer layer 110 prevents moisture and oxygen from penetrating from the outside. In addition, the buffer layer 110 may planarize a surface of the base substrate 100.

Following formation of the buffer layer 110, a semiconductor layer SA may be formed on the buffer layer 110. The semiconductor layer SA may include any one of amorphous silicon (a-Si), polycrystalline silicon (p-Si), and semiconductor oxide. In the case that the semiconductor layer SA includes the polycrystalline silicon, the semiconductor layer SA may be formed by depositing amorphous silicon (a-Si) on the buffer layer 110 and crystallizing and patterning the amorphous silicon (a-Si).

Following formation of the semiconductor layer SA, a gate insulating layer 120 may be formed on the semiconductor layer SA and the buffer layer 110. The gate insulating layer 120 may include at least one of silicon oxide and silicon nitride.

Following formation of the gate insulating layer 120, a gate electrode GE, a scan line SL, and a first capacitor electrode $C_1$ may be formed on the gate insulating layer 120. The gate electrode GE may overlap the semiconductor layer SA. A region of the semiconductor layer SA overlapping the gate electrode GE may be a channel region, and regions formed at opposite sides of the channel region may be a source region and a drain region.

Following formation of the gate electrode GE, the scan line SL, and the first capacitor electrode C1, an interlayer dielectric 130 may be formed. The interlayer dielectric 130 may include silicon oxide or silicon nitride.

Figure 5:
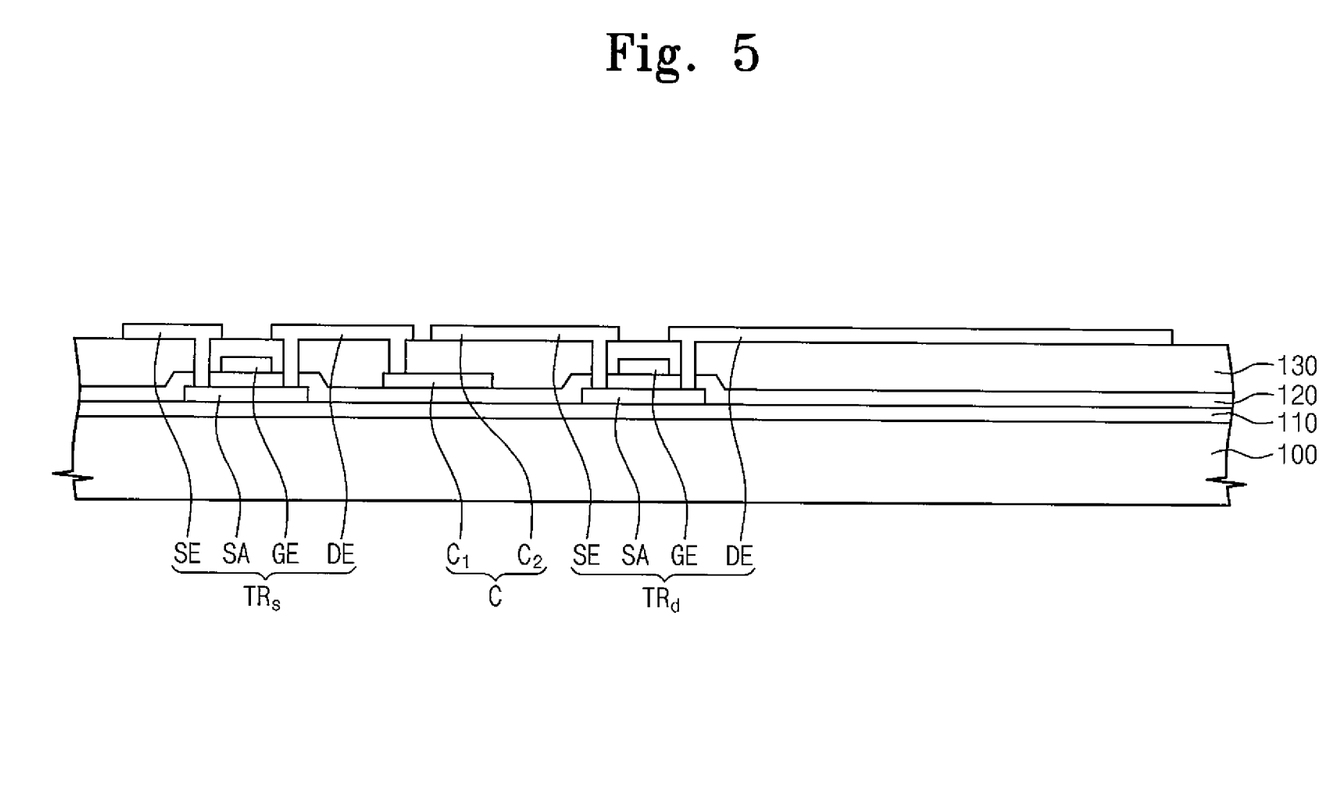

Referring to FIG. 5, following formation of the interlayer dielectric 130, the interlayer dielectric 130 may be patterned to expose the source region and the drain region. Concurrently, a portion of the first capacitor electrode $C_1$ may be exposed.

A source electrode SE connected to the source region, a drain electrode DE connected to the drain region, a second capacitor electrode $C_2$ insulated from the first capacitor electrode $C_1$, a data line DL, and a power supply line VL may be formed to form a switching thin film transistor TRs, a capacitor C, and a driving thin film transistor TRd.

That is, the switching thin film transistor TRs and the driving thin film transistor TRd each include the semiconductor layer SA, the gate electrode GE, the source electrode SE, and the drain electrode DE. The capacitor C includes the first capacitor electrode $C_1$ and the second capacitor electrode $C_2$. The drain electrode DE of the switching thin film transistor TRs may be connected to the first capacitor electrode $C_1$.

The source electrode SE, the drain electrode DE, the second capacitor electrode C2, the data line DL, and the power supply line VL may include a material which is capable of reflecting light. For example, the source electrode SE, the drain electrode DE, the second capacitor electrode $C_2$, the data line DL, and the power supply line VL may include aluminum (Al) or an aluminum-alloy (Al-alloy).

In each pixel PX, the drain electrode DE of the driving thin film transistor TRd may extend to a region in which the switching thin film transistor TRs, the capacitor C, and the driving thin film transistor TRd are not located.

Figure 6:
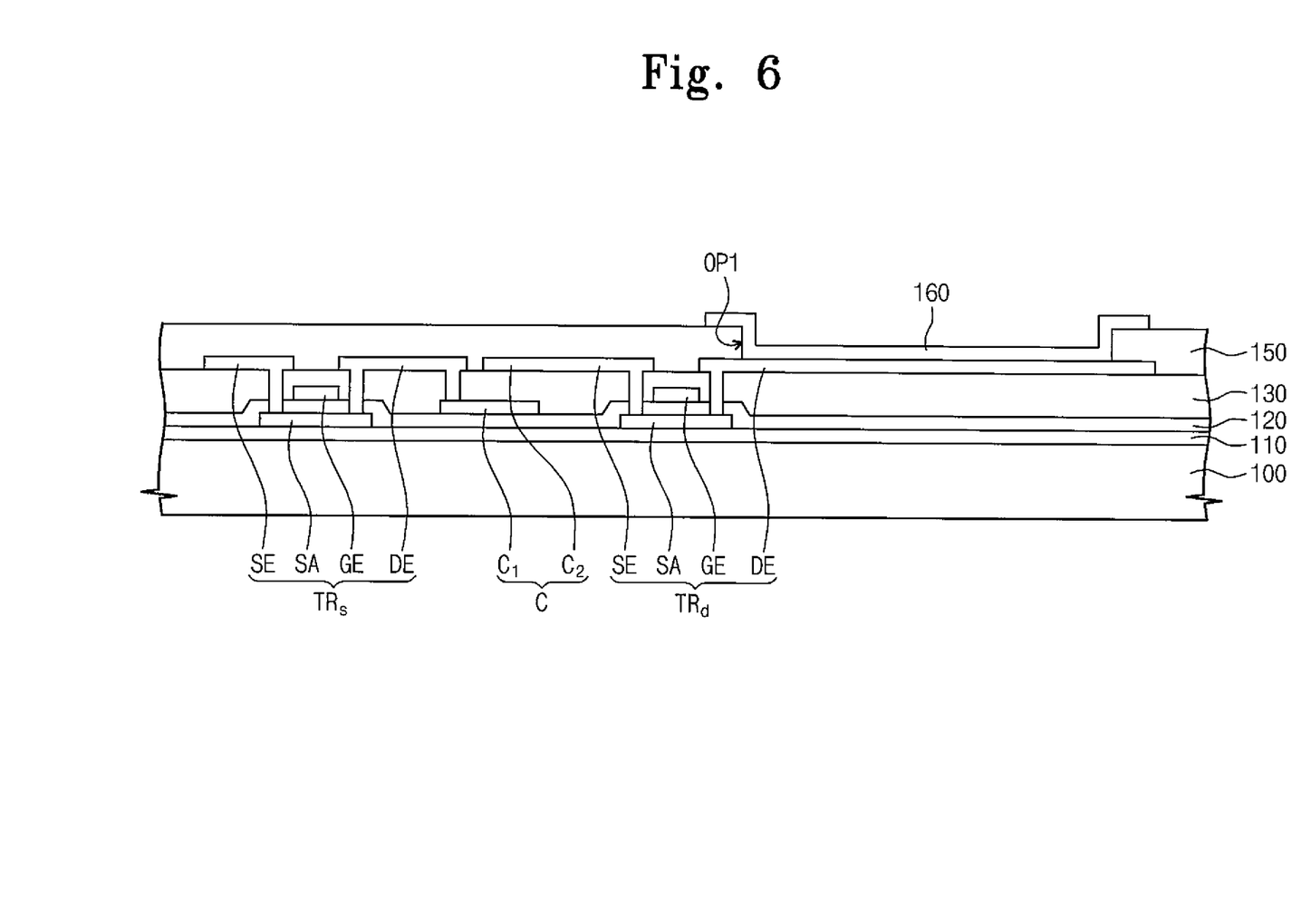

Referring to FIG. 6, a passivation layer 150 is formed on the base substrate 100 where the switching thin film transistor TRs, the capacitor C, and the driving thin film transistor TRd are formed. The passivation layer 150 may include at least one layer. For example, the passivation layer 150 may include an inorganic passivation layer and an organic passivation layer located on the inorganic passivation layer. The inorganic layer may include at least one of silicon oxide and silicon nitride. The organic passivation layer may include at least one of acryl, polyimide (PI), polyamide (PA), and benzocyclobutene (BCB). That is, the organic passivation layer may be a planarized layer that is transparent and flexible to reduce and planarize winding of a lower structure.

According to an embodiment of the present invention, the passivation layer 150 is patterned such that a first opening OP1 is formed to expose a portion of the drain electrode DE of the driving thin film transistor TRd.

Following formation of the first opening OP1, a first electrode 160 may be formed to be connected to the drain electrode DE of the driving thin film transistor TRd. A portion of the first electrode 160 may be located on the drain electrode DE exposed by the first opening OP1 to be connected to the drain electrode DE. The other portion of the first electrode 160 may extend along a side surface of the first opening OP1 to be located even on the passivation layer 150.

The first electrode 160 may be a transparent conductive oxide layer. For example, the first electrode 160 may include one of transparent conductive oxides such as ITO (Indium Tin Oxide), IZO (Indium Zinc Oxide), AZO (aluminum Zinc Oxide), GZO (gallium doped zinc oxide), ZTO (zinc tin oxide), GTO (Gallium tin oxide), and FTO (fluorine doped tin oxide). Surface resistance of the first electrode 160 may be from about 10 $\Omega/cm^2$ to about 300 $\Omega/cm^2$.

Figure 7:
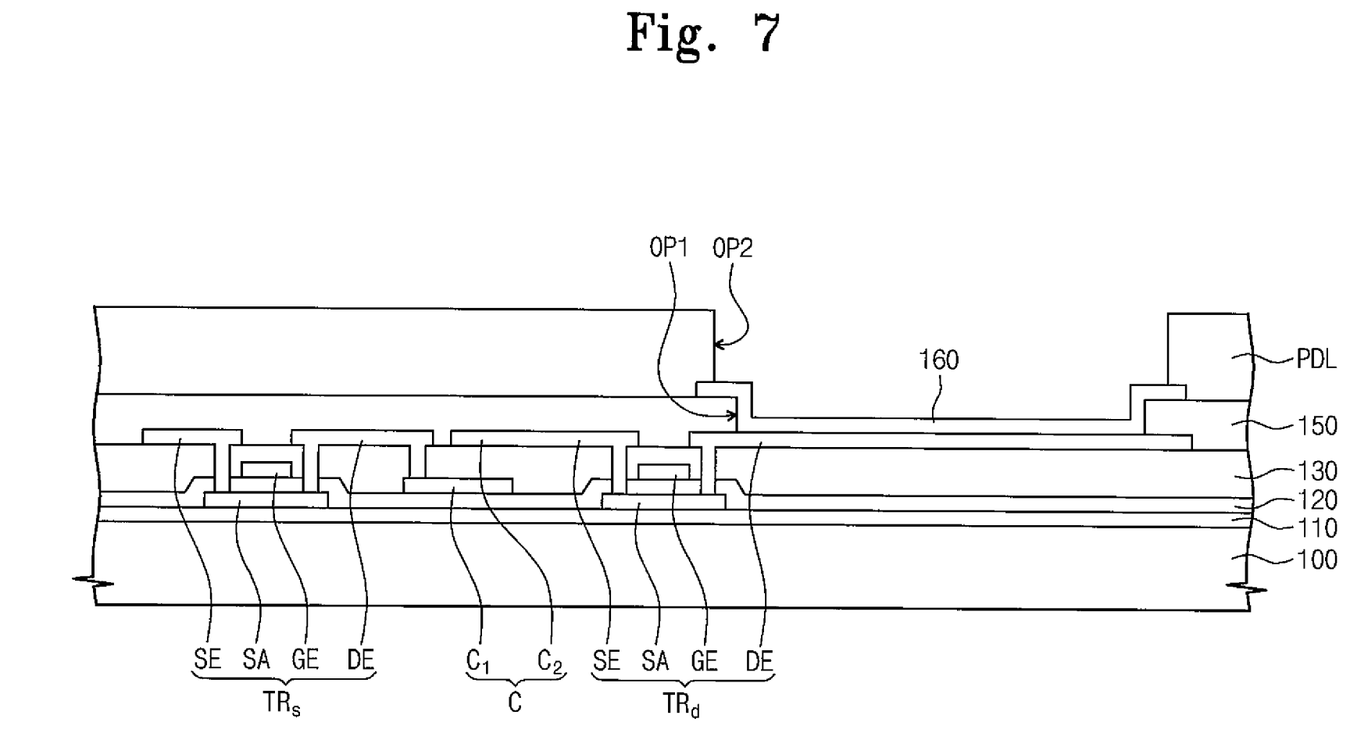

Referring to FIG. 7, following formation of the first electrode 160, a pixel defining layer PDL may be formed which has a second opening OP2 exposing a portion of the first electrode 160.

According to an embodiment of the present invention, a region opened by the second opening OP2 is wider than that opened by the first opening OP1.

Following formation of the pixel defining layer PDL, a surface of the pixel defining layer PDL is treated to have liquid-repellent properties. The surface treatment of the pixel defining layer PDL may be an oxygen plasma treatment.

Figure 8:
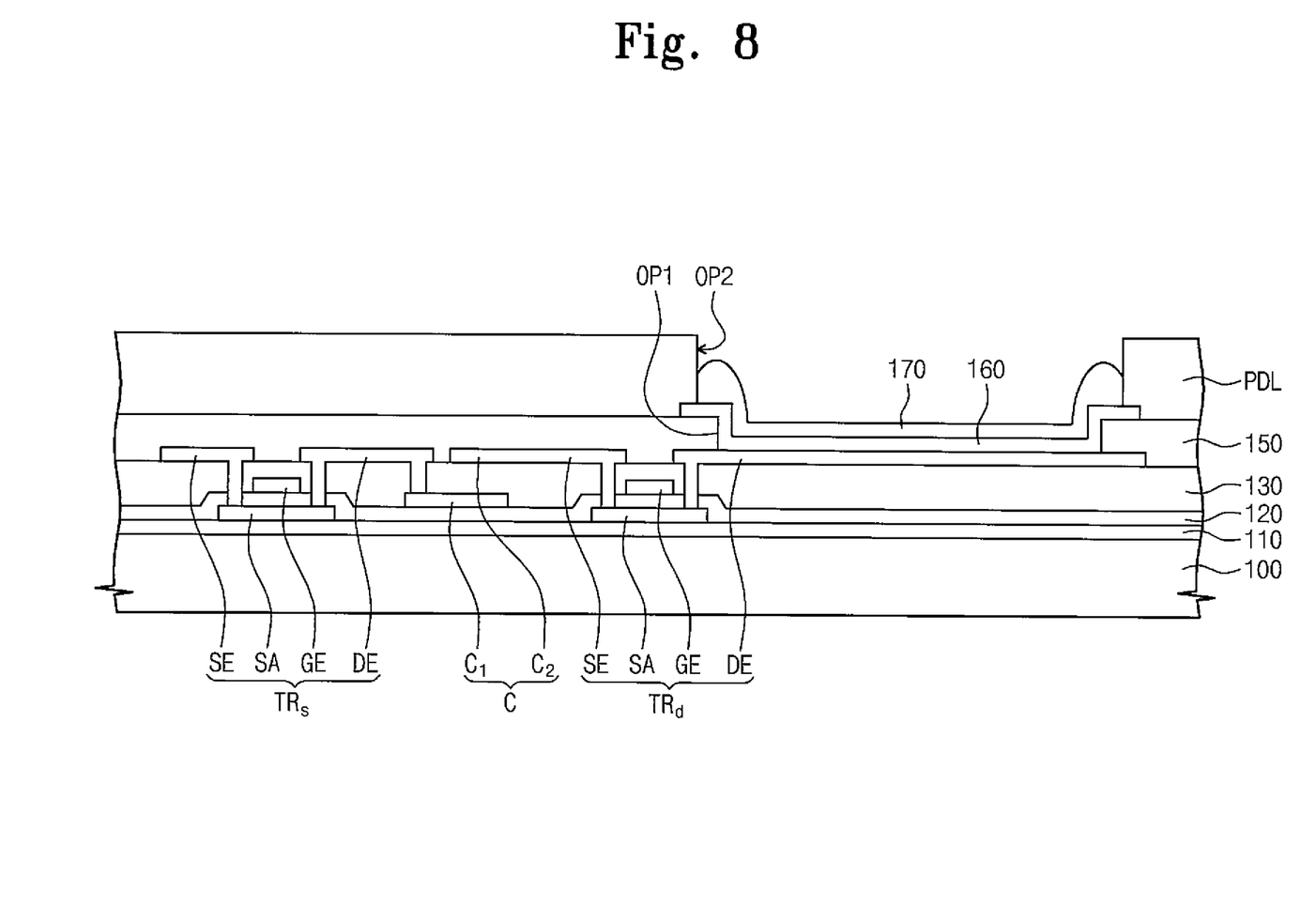

Referring to FIG. 8, following the surface treatment of the pixel defining layer PDL, an organic layer 170 may be formed on the first electrode 160. The organic layer 170 may be formed by means of inkjet printing.

Because the pixel defining layer PDL has liquid-repellent properties, the organic layer 170 arrangement may be limited to within the region opened by the second opening OP2. For example, the organic layer 170 may be located not only in a region formed on the drain electrode DE but also in a region formed on the passivation layer 150.

A portion of the organic layer 170 at (or near) the edge region adjacent to the pixel defining layer PDL may be formed thicker than other portions of the organic layer 170, due to, for example, surface tension (or energy). In particular, the organic layer 170 formed on the first electrode 160 on the passivation layer 150 may be thicker than the organic layer 170 formed on other portions of the first electrode 160.

The organic layer 170 includes at least an emission layer EML and may generally have a multi-layered thin film structure. For example, the organic layer 170 may include a hole injection layer (HIL) injecting holes, a hole transport layer (HTL) having superior hole transportability and blocking migration of non-combined electrons at the EML to increase a change for hole-electron recombination, the EML emitting light by recombination of injected electrons and holes, a hole blocking layer (HBL) blocking migration of non-combined holes at the EML, an electron transport layer (ETL) for smoothly transporting electrons to the EML, and an electron injection layer (EIL) injecting electrons.

Figure 9:
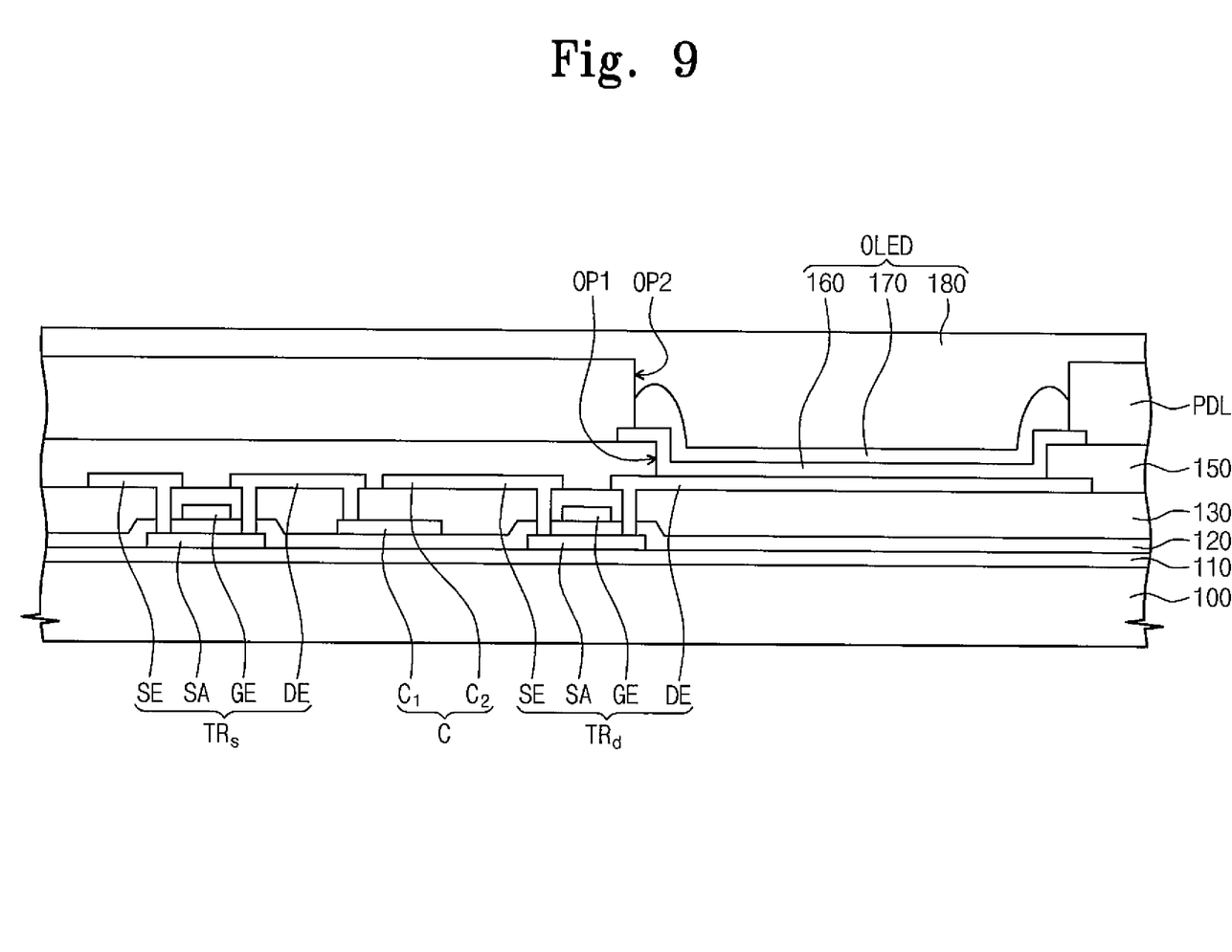

Referring to FIG. 9, following formation of the organic layer 170, a second electrode 180 is formed on the organic layer 170 to fabricate an organic light emitting diode (OLED). The second electrode 180 may include at least one of metals with low work function such as Ag, Mg, Al, Pt, Pd, Au, Ni, Nd, Ir, Cr, Li, Ca, and an alloy thereof and may include a metal thin film formed on the organic layer 170 to a thickness suitable to allow light to pass therethrough. The second electrode 180 may further include a transparent conductive oxide layer on the metal thin film to prevent voltage drop (IR-drop) of the metal thin film.

Following formation of the second electrode 180, an organic light emitting display device may be fabricated by means of a conventional encapsulation process. For example, the organic light emitting display device may be fabricated by forming an encapsulation substrate (not shown) including a transparent insulating material on the second electrode 180 and bonding the encapsulation substrate to the base substrate 100 where the OLED is located.

In addition, the organic light emitting display device may be fabricated by forming a transparent insulating layer (not shown) on the second electrode 180 such that the OLED is isolated from the external environment.

As described so far, uniform light can be emitted in each pixel to improve display quality of an organic light emitting display device.

While the present invention has been particularly shown and described with reference to exemplary embodiments thereof, it will be apparent to those of ordinary skill in the art that various changes in form and detail may be made therein without departing from the spirit and scope of the present invention as defined by the following claims and their equivalents.

What is claimed is:

1. An organic light emitting display device comprising:
   a thin film transistor on a base substrate and comprising a semiconductor layer, a gate electrode, a source electrode, and a drain electrode; and
   an organic light emitting diode comprising a first electrode connected to the drain electrode, an organic layer on the first electrode, and a second electrode on the organic layer,
   wherein the drain electrode has a larger area than the first electrode.

2. The organic light emitting display device of claim 1, wherein a thickness of a first portion of the organic layer corresponding to a region in which the first electrode contacts the drain electrode is smaller than that of a second portion of the organic layer corresponding to a region in which the first electrode does not contact the drain electrode.

3. The organic light emitting display device of claim 2, wherein the first electrode comprises transparent conductive oxide, and a surface resistance of the first electrode is from about 10 $\Omega/cm^2$ to about 300 $\Omega/cm^2$.

4. The organic light emitting display device of claim 3, wherein the drain electrode is configured to reflect light.

5. An organic light emitting display device comprising:
   a semiconductor layer on a base substrate and comprising a source region and a drain region;
   a gate electrode on the semiconductor layer and insulated from the semiconductor layer;
   a source electrode connected to the source region and a drain electrode connected to the drain region;
   a passivation layer having a first opening exposing the drain electrode;
   a first electrode connected to the drain electrode, and arranged at the first opening and on the passivation layer;
   a pixel defining layer having a second opening exposing a portion of the first electrode;
   an organic layer on the first electrode; and
   a second electrode on the organic layer,
   wherein an area exposed by the second opening is larger than that exposed by the first opening,
   wherein a first portion of the first electrode is located on the drain electrode exposed by the first opening to contact the drain electrode,
   wherein a second portion of the first electrode extends along a side surface of the first opening to be located on the passivation layer, and
   wherein the first portion is larger than the second portion.

6. The organic light emitting display device of claim 5, wherein in the organic layer, a thickness of a first region corresponding to the first opening is smaller than that of a second region corresponding to the second opening outside the first opening.

7. The organic light emitting display device of claim 6, wherein the first electrode comprises a transparent conductive oxide and a surface resistance of the first electrode is from about 10 $\Omega/cm^2$ to about 300 $\Omega/cm^2$.

8. The organic light emitting display device of claim 7, wherein the drain electrode is configured to reflect light.

9. The organic light emitting display device of claim 7, wherein a surface of the pixel defining layer has liquid-repellent properties.

10. The organic light emitting display device of claim 5, wherein the drain electrode has a larger area that the first electrode.

11. A method of fabricating an organic light emitting display device, the method comprising:
    forming a thin film transistor comprising a semiconductor layer, a gate electrode, a source electrode, and a drain electrode on a base substrate;
    forming a passivation layer covering the thin film transistor and having an opening exposing the drain electrode; and
    forming an organic light emitting diode comprising a first electrode connected to the drain electrode, an organic layer on the first electrode, and a second electrode on the organic layer,
    wherein the drain electrode has a larger area than the first electrode.

12. The method of claim 11, wherein a thickness of a first portion of the organic layer corresponding to a region in which the first electrode contacts the drain electrode is smaller than that of a second portion of the organic layer corresponding to a region in which the first electrode does not contact the drain electrode.

13. The method of claim 12, wherein the first electrode comprises a transparent conductive oxide, and a surface resistance of the first electrode is from about 10 $\Omega/cm^2$ to about 300 $\Omega/cm^2$.

14. The method of claim 13, wherein the drain electrode is configured to reflect light.

15. A method for fabricating an organic light emitting display device, comprising:
    forming a semiconductor layer on a base substrate;
    forming a gate electrode insulated from the semiconductor layer;
    forming a source electrode and a drain electrode connected to a source region and a drain region of the semiconductor layer, respectively;
    forming a passivation layer having a first opening exposing at least a portion of the drain electrode;
    forming a first electrode on the drain electrode and the passivation layer;
    forming a pixel defining layer having a second opening exposing at least a portion of the first electrode;
    forming an organic layer on the first electrode; and
    forming a second electrode on the organic layer,
    wherein an area exposed by the second opening is larger than that exposed by the first opening,
    wherein a first portion of the first electrode is located on the drain electrode exposed by the first opening to contact the drain electrode, wherein a second portion of the first electrode extends along a side surface of the first opening to be located on the passivation layer, and wherein the first portion is larger than the second portion.

16. The method of claim 15, further comprising:

treating a surface of the pixel defining layer to have liquid-repellent properties.

17. The method of claim 16, wherein in the organic layer, a thickness of a first region corresponding to the first opening is smaller than that of a second region corresponding to the second opening outside the first opening.

18. The method of claim 17, wherein the first electrode comprises a transparent conductive oxide and a surface resistance of the first electrode is from about 10 $\Omega/cm^2$ to about 300 $\Omega/cm^2$.

19. The method of claim 15, wherein the drain electrode has a larger area than the first electrode.

20. The method of claim 15, wherein the drain electrode is configured to reflect light.

* * * * *